United States Patent
Schnizlein

[19]

[11] Patent Number: 5,987,010
[45] Date of Patent: *Nov. 16, 1999

[54] SYSTEM AND METHOD FOR PROVIDING FDD AND TDD MODES OF OPERATION FOR A WIRELESS COMMUNICATIONS DEVICE

[75] Inventor: Paul G. Schnizlein, Austin, Tex.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/856,541

[22] Filed: May 15, 1997

[51] Int. Cl.$^6$ .......................................................... H04J 3/00
[52] U.S. Cl. ............................................ 370/280; 370/281
[58] Field of Search .................................... 370/307, 276, 370/277, 279, 280, 281, 293, 294, 295, 335, 342, 310, 282; 455/78, 101, 133, 20, 93, 112, 113, 118, 553

[56] References Cited

U.S. PATENT DOCUMENTS

| | | | |
|---|---|---|---|
| 5,465,409 | 11/1995 | Borras et al. | 370/280 |
| 5,475,677 | 12/1995 | Arnold et al. | 370/280 |
| 5,513,184 | 4/1996 | Vannucci | 370/350 |
| 5,590,173 | 12/1996 | Beasley | 370/281 |
| 5,689,502 | 11/1997 | Scott | 370/281 |
| 5,715,525 | 2/1998 | Tarusawa et al. | 455/101 |
| 5,754,961 | 5/1998 | Serizawa et al. | 370/468 |
| 5,828,658 | 10/1998 | Ottersten et al. | 370/310 |
| 5,850,393 | 12/1998 | Adachi | 370/335 |

*Primary Examiner*—Dang Ton
*Assistant Examiner*—Phirin Sam
*Attorney, Agent, or Firm*—Skjerven, Morrill, MacPherson, Franklin & Friel, L.L.P.

[57] ABSTRACT

A system and method is described herein for providing FDD and TDD modes of operation for a wireless communications device. The system includes a clock signal for FDD mode operation, a separate clock signal for TDD mode operation, where the TDD mode clock is twice the frequency of the FDD clock. Additionally, a counter is provided for counting bit times during a transmission or receive frame. The clock counter is reloaded after a pre-specified count is achieved. The pre-specified count is twice as great in TDD mode operation than in FDD mode operation to account for the fact that the bit periods are twice as long in FDD operation than during TDD operation since transmit and receive are at different frequencies and are not sharing the same channel.

20 Claims, 3 Drawing Sheets

SYSTEM AND METHOD FOR PROVIDING FDD AND TDD MODES OF OPERATION FOR A WIRELESS COMMUNICATIONS DEVICE

BACKGROUND OF THE INVENTION

1. Field of the Invention

This invention relates to a system and method of providing FDD and TDD modes of operation for a wireless communications device.

2. Discussion of Related Technology

Many wireless telephones today utilize only a time division duplex (TDD) mode of operation. In a typical TDD operation, a wireless telephone unit and a base unit each transmit for about one millisecond and receive for about one millisecond, thereby sharing the same radio channel. This presents certain disadvantages, for example, in TDD, communication must be at a higher bit rate since a transmitter and receiver are on the same channel. Communication cannot be continuous, since transmit and receive modes have interleaved time slots preassigned. Also, the higher bit rate implies lower energy, so the bit energy to noise ratio is worse than for a frequency division duplex (FDD) mode of operation. The increased noise ratio shortens the useful range of a TDD system.

Thus, the need arises for a wireless communications system which provides operation in both the TDD mode and the FDD mode, allowing for higher energy operation, with increased range and continuous operation over different channels for receive and transmit.

SUMMARY OF THE INVENTION

The present invention is for a wireless communications system and method which provides for formatting of signals for both time division duplex (TDD) and frequency division duplex (FDD) modes of operation. Using FDD mode requires continuous operation over two different frequencies, which has a slight disadvantage of using twice the bandwidth compared to TDD, however, certain advantages are also extant. For example, in FDD mode signals can be sent at a slower bit rate, for example, between a wireless telephone handset unit and a remote base station. The slower bit rate of the FDD mode of operation means that each bit transmitted has a higher energy, so the bit energy to noise ratio is better than that of TDD. This higher ratio increases the broadcast range of the system.

Additionally, many manufacturers have developed cost-effective FDD formatted wireless radios which have been developed for certain markets. These manufacturers can more easily switch to digital cordless products if the digital message employed uses FDD operation. Less control software needs to be revamped. Additionally, TDD radios sometimes have problems inherent in their burst method of transmitting and then receiving. Among these problems are radio noise at the TDD rate and the ability to demodulate the first bit of a burst correctly. FDD operation avoids these problems.

Another advantage of the present invention is that the FDD mode can be installed as a programmable option for a normally TDD system. This allows the same chip set to be used in an FDD and TDD system environment. For a TDD system, the FDD programming mode would not be utilized. Thus, cost savings are arrived at by being able to supply a single chip set which can be utilized for both TDD and FDD applications.

DETAILED DESCRIPTION OF THE PREFERRED EMBODIMENTS

Figure 1:
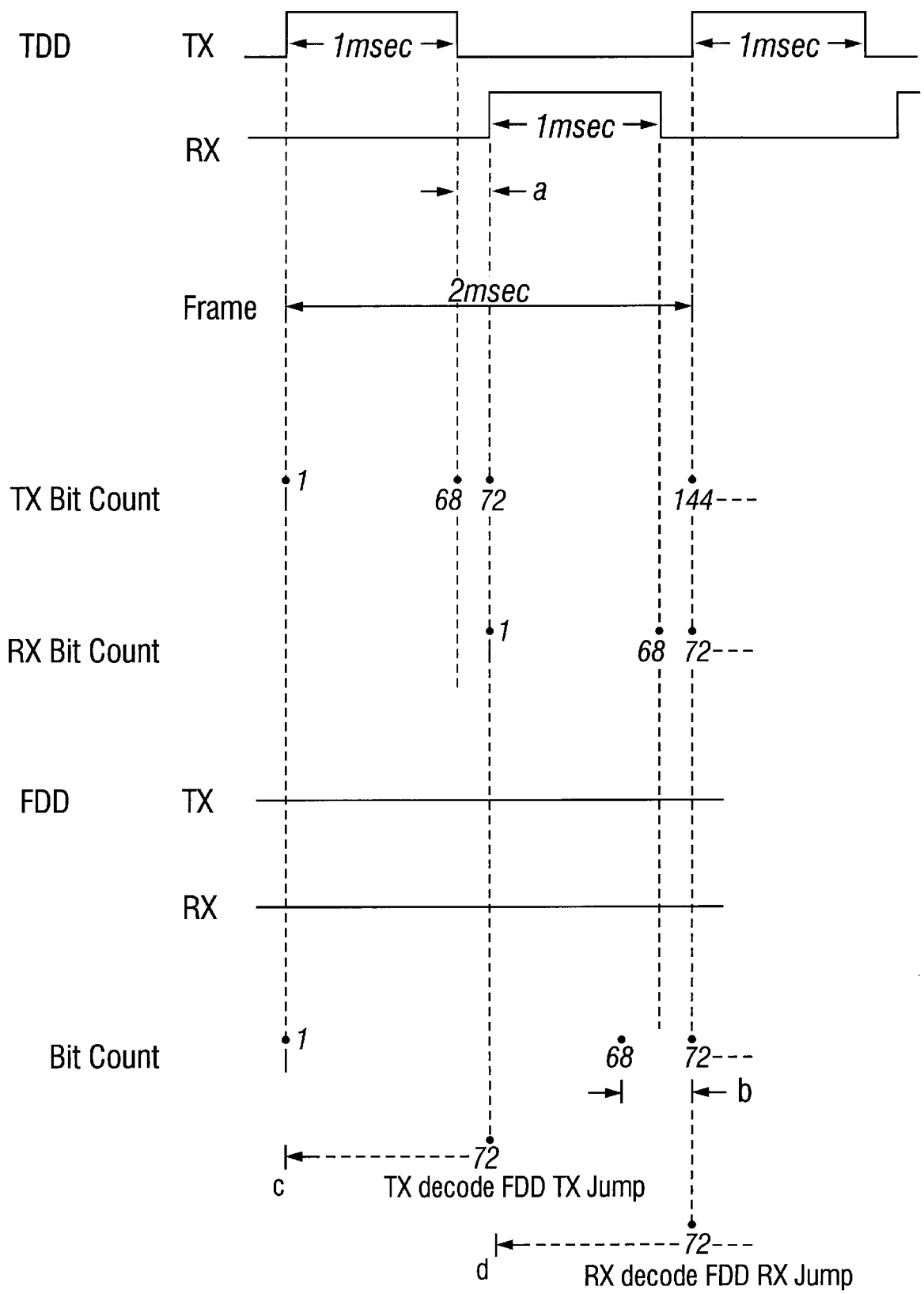
FIG. 1 is a timing diagram for TDD and FDD signals.

FIG. 1 is a timing diagram showing typical TDD timing, FDD timing and bit counts for transmit (TX) and receive (RX) communication. As shown, the TDD system transmits (TX) for about 1 ms, then has a gap period "a", then receives (RX) for about 1 ms. This pattern repeats every 2 ms, and is known as a frame. The TDD scheme shown may be used by a wireless telephone, wireless radio or other wireless communications device utilizing TDD mode of operation.

Figure 2:
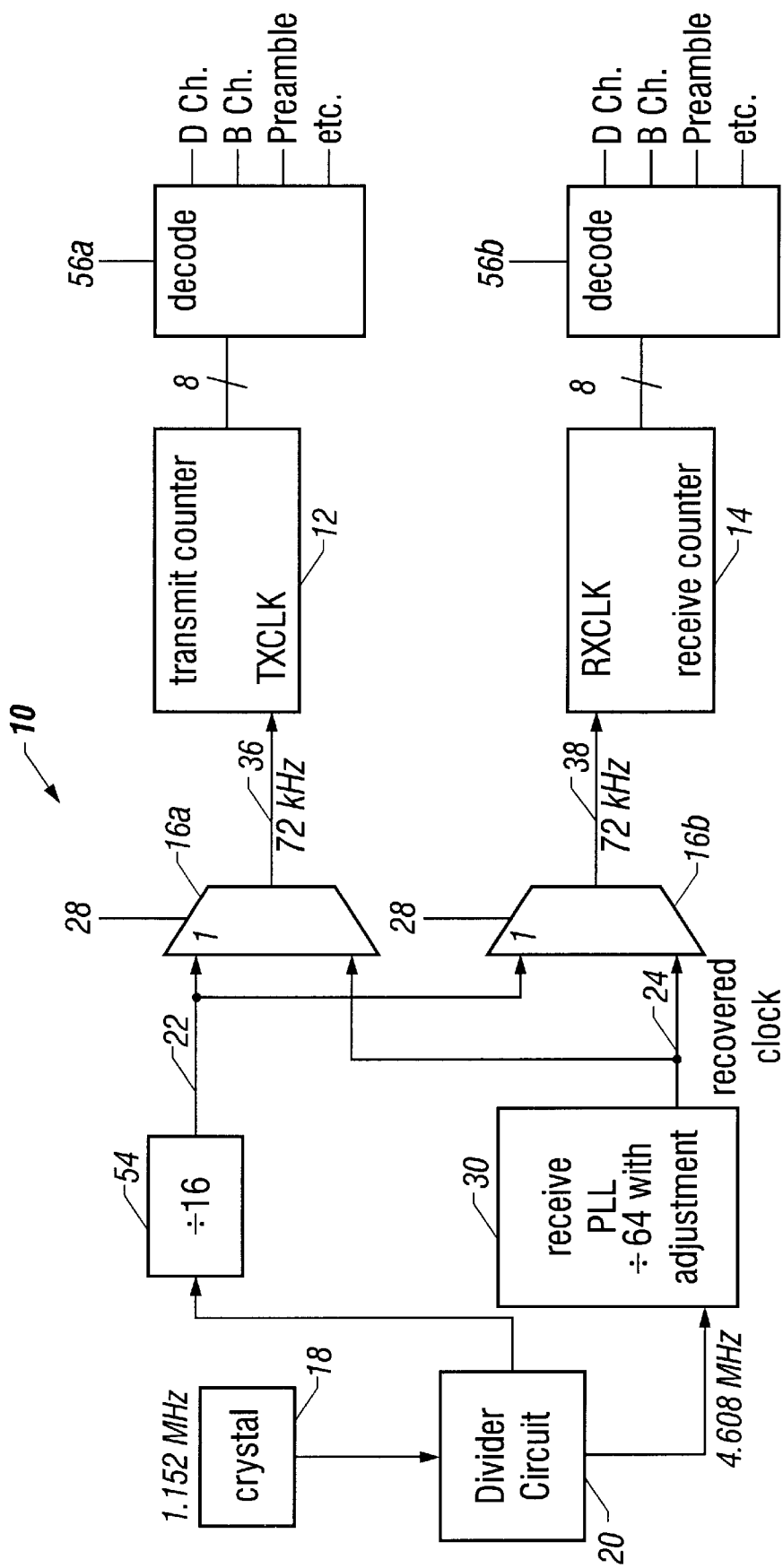
FIG. 2 schematically illustrates an embodiment of a prior art clock generation system for TDD signals.

A typical prior art TDD system may have a transmit counter 12, shown in FIG. 2, that counts the bits to be transmitted, for example, from counts 1 through 68. No bits are transmitted during counts 68 to 144. This bit count scheme for TDD is illustrated in FIG. 1. After a count of 144 is achieved, the transmit count repeats from 1 to 144. This repetition period is the "frame." A similar receive counter 14, shown in FIG. 2, may count received bits 1 to 68, where bit count 1 corresponds with transmit count 72, as shown in FIG. 1. No bits are received during bit counts 68 to 144. Instead of separate transmit and receive counters, a single counter may be used. For the preferred embodiment, a two counter system is described now. A single counter scheme is explained below.

The FDD operation is now described. As shown in FIG. 1, for FDD operation, both the TX and RX radio control signals are active for the entire frame. In this case, the signals are active for twice the period than in TDD mode operation, and will repeat after just 72 counts, instead of 144 counts as for TDD. In FDD, each count is twice as long as in TDD. Since the FDD counts 1 to 68 will each take a larger portion of the frame for FDD operation, i.e. twice the period of a TDD count, including the TDD gap time "a", an alternating pattern, such as "1010" or other alternating pattern, is provided to keep the demodulator balanced. This alternating pattern is inserted between FDD counts 68 and 72 in gap "b" in FIG. 1. To incorporate this FDD timing into a scheme which presently utilizes only a TDD mode transmit counter, the counter is reloaded after a count of 72 is achieved, to reset the counter 12 to a count of one. Thus, TDD TX count 72 is decoded, which generates a signal (FDDTXJUMP) to reload the transmit counter 12 back to count 1. This is illustrated in FIG. 1 as "TX decode FDDTXJUMP, which causes the counter 12 to return to count 1, shown as point "c" in FIG. 1. A similar reload scheme for the receive counter 14 is accomplished when TDD RX count 72 is achieved.

As described above, FIG. 2 depicts a prior art TDD system timing generator 10 including a transmit counter 12 and a receive counter 14. Their respective counts are decoded to make timing signals that synchronize to provide or to receive the data (D) channel, bearer (B) channel, and other components of a TDD system frame. The 72 Khz clocks that advance these counters are selected by a clock selection circuit, such as multiplexer (MUX) 16a and b. Clock enable signal 28 controls the respective MUX to which it is provided to select between fixed clock 22 from divide by 16 circuit 54 and recovered clock 24 from a clock recovery phase locked loop (PLL) circuit 30 known in the art which is phase-locked to the TDD receive data, as the clock to be provided to transmit counter 12 or receive counter 14. For the transmit and receive modes associated with a TDD communication system, each counter advances its count based on the clock signal it receives as transmit counter clock signal 36 or receive counter clock signal 38. Both clock signals 36 and 38 are derived from a fixed crystal 18 which is then input into a divider circuit 20. Divider circuit 20 outputs a 1.152 MHz clock for input to divide by 16 circuit 54 and a 4.608 MHz clock for input to PLL circuit 30. FIG. 2 depicts the generation of the fixed clock 22 by dividing, for example, a 1.152 MHz clock signal by 16 in divide by 16 circuit 54. The recovered clock 24, derived inside PLL circuit 30 uses, for example, a 4.608 MHz fixed clock output from divider circuit 20 as a basis. Other clock frequencies may be used in other embodiments.

Figure 3:
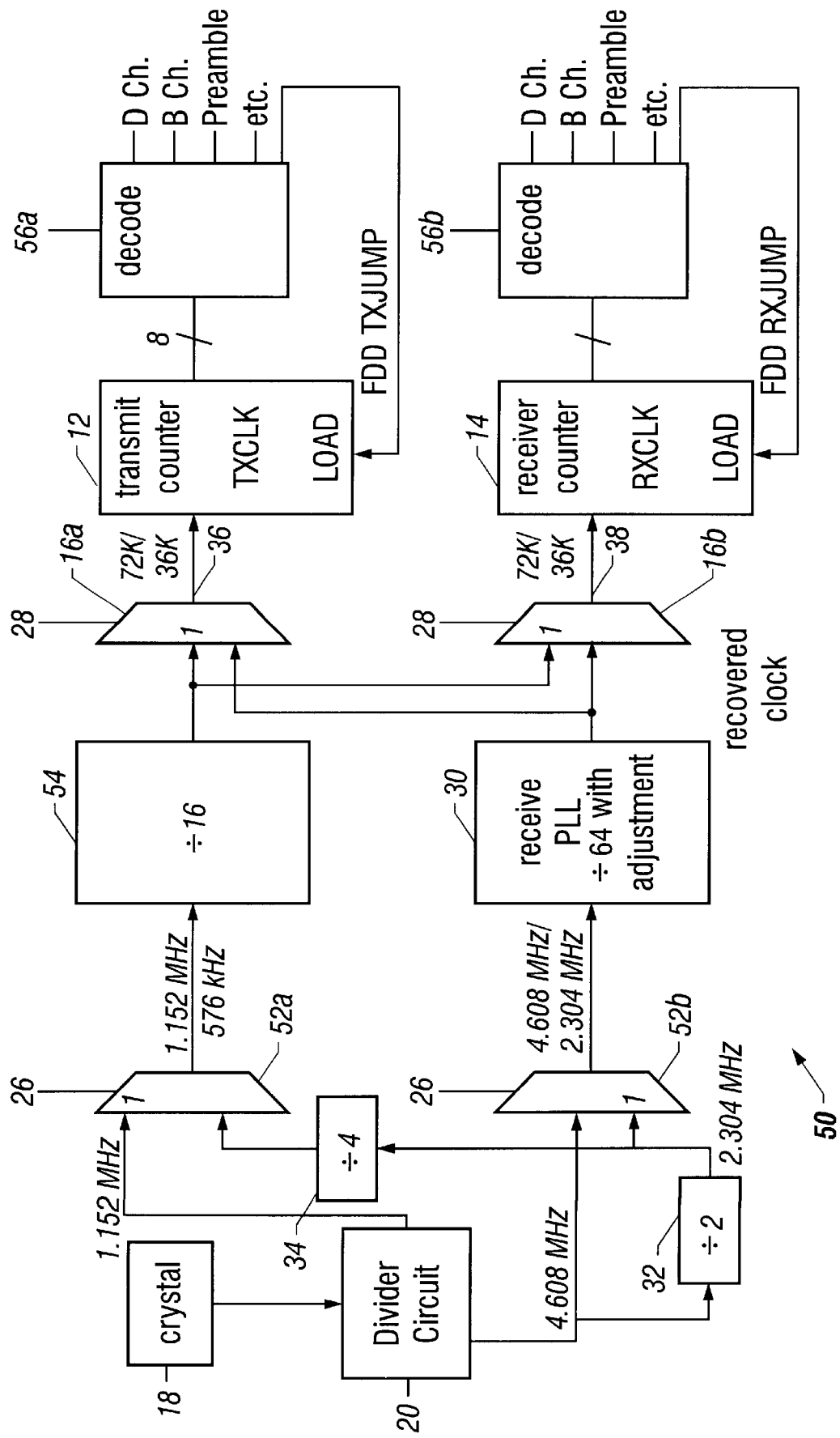
FIG. 3 schematically illustrates an embodiment of a FDD/TDD clock generation system of the present invention.

FIG. 3 shows an embodiment of the system and method of the present invention. The combined FDD/TDD timing generator 50 generates frame timing for both TDD protocol and FDD protocol, based on the programmable input signal 26, shown as a control input to MUX 52a and b. Signal 26 is used to select an appropriate clock signal for FDD or TDD operation. Signal 26 controls MUX 52a to select between the fixed 1.152 MHz clock and a fixed 576 Khz clock, output from divide by 4 circuit 34, for input to the divide by 16 circuit 54. In FDD mode, MUX 52a selects a clock that is one half the frequency of the TDD clock. Thus, in FDD mode, the 576 Khz clock is selected and is provided to the divide by 16 circuit 54, which in turn generates a 36 Khz clock as the transmit clock 36 or receive clock 38, for FDD operation. Control signal 26 is also used to control MUX 52b to select between the 4.608 MHz fixed clock signal output from divider circuit 20, and a 2.304 MHz clock output from divide by two circuit 32, to provide to the PLL circuit 30. In FDD mode, MUX 52b selects a clock that is one half the frequency of the TDD clock.

The signal FDDTXJUMP is generated by transmit counter decode circuit 56a by a count of 72 being achieved by the transmit counter 12. This signal is provided to counter 12 to load the transmit counter 12 to a new count of one. The signal FDDRXJUMP is generated by receive counter decode circuit 56b by a count of 72 being achieved by the receive counter 14. This signal is similarly provided to counter 14 to load the receive counter 14 to a new count of one.

One main concept of the embodiments of the present invention is that for FDD mode operation, a clock is provided to the transmit and receive counters, 12 and 14, respectively, which are each one half the frequency of the clock used for TDD mode operation. This achieves bit periods for FDD mode operation that are twice as long as for TDD mode operation. This is also what leads to the beneficial result of an extended communication range, since a bit period twice as long, as in FDD mode operation, results in twice as much energy in each bit than for TDD mode operation where the clock frequency is twice as great. This scheme results in an effective 3 dB increase in signal to background noise ratio over a TDD transmission scheme.

The FDDTXJUMP and FDDRXJUMP signals are used to reload their respective counters so they count half as many counts in FDD mode as in TDD mode. In TDD mode, the transmitter is off about half the time, but in FDD mode, it stays on indefinitely. This elimination of counts effectively removes the "off" time out of the FDD cycle. Combined with the lengthening of each bit, this results in a FDD frame time that is still 2 ms, the same as the TDD frame rate. Implementing the reload scheme as described herein is accomplished by methods known in the art. Additionally, those skilled in the art know how to decode a count of 72, irrespective of the control software used. If a particular existing TDD implementation does not use a loadable counter, it is necessary to upgrade to a loadable version.

If an existing TDD system already utilizes a loadable transmit counter, the FDDTXJUMP signal will be a logic input to the logic function which produces the value to be loaded. A similar scheme could be used for an existing loadable receive counter in a TDD system.

Another embodiment implements a TDD protocol block using a single counter instead of two separate counters, one for transmit and one for receive, as previously described herein. One can still use the method described herein, that is, reduce the frequency of the counter input clock and make the counter "jump back" by reloading it. But in that case, the receive bit counts that contain receive bits may be numbered 72 to 144, and if the counter is reloaded at a count of 72, decoding the bit counts for the receive bits may not be accomplished. This problem is manageable, although a bit more inconvenient.

Consider the decode block 56b of the receive counter 14 in FIG. 3. Each selected bit time can be decoded twice: one decode for FDD mode and a separate decode for TDD mode. For example, suppose the D channel decode signal is active in the transmitter at bits 1 and 2, and in the receiver at bits 73 and 74, identifying these bits as D channel bits. Then, when the receive counter is reloaded in FDD mode, it never reaches count 73 because a jump from 72 to 1 occurred. The D channel decode code could then be modified to: "receive a D bit=[(count 73 OR count 74) AND (NOTFDDMODE)] OR [(count 1 OR count 2) AND FDD MODE"]. This amounts to selecting a different decode value when in FDD mode. This example simply illustrates that the method of this invention may be utilized on TDD implementations quite different from the one shown in the prior art system of FIG. 2.

Notice that this method of adapting a TDD protocol to an existing FDD protocol system preserves system uniformity. The frame rate stays the same, so the throughput of the B channel is constant. Also the D channel throughput is unchanged. The order of the bits in the frame is also unchanged. Together, these similarities mean that a substantial amount of the software used to control a TDD wireless communications device can be used in FDD mode operation, resulting in reduced software development costs.

The foregoing disclosure and description of the invention and examples provided are illustrative and explanatory of the preferred embodiments. Changes in the size, shape, materials, elements and individual components used, the connections made, may be made without departing from the spirit and scope of the inventions herein claimed.

What is claimed is:

1. A method of operating in both an FDD mode and a TDD mode for a wireless digital communications device, comprising the steps of:

a) providing a first clock signal for FDD mode operation;

b) providing a second clock signal for TDD mode operation;

c) providing a clock counter;

d) selecting between said first clock signal and said second clock signal to be input to said clock counter, wherein for FDD operation said first clock signal is input to said clock counter and for TDD operation said second clock signal is input to said clock counter; and e) reloading said clock counter to a predetermined count value after a pre-specified-count is achieved by said clock counter, the pre-specified count value depending upon one of FDD operation and TDD operation.

2. The method of claim 1, wherein said clock counter comprises a transmit counter and a receive counter.

3. The method of claim 1, wherein said step of reloading is accomplished after said clock counter achieves a count of 72.

4. The method of claim 1, wherein said step of reloading is accomplished after said clock counter achieves a count of 144.

5. The method of claim 1, wherein said pre-specified count corresponds with a frame rate for a wireless digital communications device.

6. The method of claim 1, wherein said step of providing a first clock signal is accomplished by selecting between a fixed clock signal and a recovered clock signal.

7. The method of claim 6, wherein said fixed clock signal and said recovered clock signal are both at a first frequency for FDD mode operation and are both at a second frequency for TDD mode operation.

8. The method of claim 1, wherein said second clock signal has a rate twice that of said first clock signal.

9. The method as recited in claim 1 wherein said predetermined count value is zero.

10. A system for implementing FDD and TDD modes of operation for a wireless digital communications device, comprising:
   a) a first clock signal generator which generates an FDD mode clock signal;
   b) a second clock signal generator which generates a TDD mode clock signal;
   c) a clock counter;
   d) a selector device which selects between an output from said first clock signal generator and said second clock signal generator for input to said clock counter according to whether the system is operating in FDD or TDD mode;
   wherein said clock counter is reloaded to a predetermined count value after said clock counter achieves a first pre-specified count for FDD mode of operations, and a second pre-specified count for TDD mode of operation.

11. The system of claim 10, wherein said FDD mode clock signal has a rate one half that of said TDD mode clock signal.

12. The system of claim 10, wherein said second pre-specified count is twice that of said first pre-specified count.

13. The system of claim 10, wherein said first count and said second count each correspond to a frame rate for a wireless digital communications device.

14. The system of claim 10, wherein said clock counter comprises a transmit counter and a receive counter.

15. The system of claim 10, wherein said first clock signal generator generates said FDD mode clock signal by selecting between a fixed clock signal and a recovered clock signal.

16. The system of claim 10, wherein said second clock signal generator generates said TDD mode clock signal by selecting between a fixed clock signal and a recovered clock signal.

17. The system as recited in claim 10 wherein said predetermined count value is zero.

18. A system for implementing FDD and TDD modes of operation for a wireless digital communications device, comprising:
   a base clock signal generator;
   a first division circuit coupled to the base clock signal generator, the first division circuit operable to generate an FDD clock signal from a base clock signal generated by the base clock signal generator;
   a second division circuit coupled to the base clock signal generator, the second division circuit operable to generate a TDD clock signal from the base clock signal;
   a selector coupled to the first and second division circuits, the selector operable to receive a mode select signal, the selector selecting between the FDD clock signal and the TDD clock signal according to the mode select signal;
   a counter coupled to the selector; and
   a decode circuit coupled to the counter, the decode circuit operable to receive a counter signal from the counter and to provide a reload signal to the counter, the reload signal causing the counter to return to a predetermined value.

19. The system of claim 18 wherein the decode circuit is operable to receive the mode select signal, the decode circuit providing the reload signal according to the mode select signal.

20. The system of claim 18 wherein the decode circuit is operable to receive a clock signal selected by the selector, the decode circuit providing the reload signal according to the clock signal.

* * * * *